United States Patent [19]
Yin et al.

[11] Patent Number: 5,970,005
[45] Date of Patent: Oct. 19, 1999

[54] TESTING STRUCTURE AND METHOD FOR HIGH DENSITY PLDS WHICH HAVE FLEXIBLE LOGIC BUILT-IN BLOCKS

[75] Inventors: Yiyian P. Yin, Campbell; Ping Xiao, San Jose, both of Calif.

[73] Assignee: ICT, Inc., San Jose, Calif.

[21] Appl. No.: 09/069,016

[22] Filed: Apr. 27, 1998

[51] Int. Cl.⁶ .................................................. G11C 7/00
[52] U.S. Cl. ................ 365/201; 365/185.22; 365/189.08
[58] Field of Search ......................... 365/185.22, 185.09, 365/185.25, 201, 189.08; 371/22.2, 21.1, 21.2

[56] References Cited

U.S. PATENT DOCUMENTS

| | | | |
|---|---|---|---|
| 4,124,899 | 11/1978 | Birkner et al. | 364/716 |
| 4,672,534 | 6/1987 | Kamiya | 364/200 |
| 4,879,688 | 11/1989 | Turner et al. | 365/201 |
| 4,885,719 | 12/1989 | Brahmbhatt | 365/181 |
| 4,918,641 | 4/1990 | Jigour et al. | 364/716 |
| 5,016,217 | 5/1991 | Brahmbhatt | 365/185 |
| 5,046,035 | 9/1991 | Jigour et al. | 364/716 |
| 5,157,781 | 10/1992 | Harwood et al. | 714/30 |
| 5,241,224 | 8/1993 | Pederson et al. | 326/41 |
| 5,352,940 | 10/1994 | Watson | 365/189.08 |
| 5,543,730 | 8/1996 | Cliff et al. | 326/38 |
| 5,781,031 | 7/1998 | Bertin et al. | 365/189.08 |
| 5,787,097 | 7/1998 | Roohparvar et al. | 365/201 |
| 5,825,782 | 10/1998 | Roohparvar | 365/201 |

*Primary Examiner*—David Nelms
*Assistant Examiner*—Gene N. Auduong
*Attorney, Agent, or Firm*—Townsend and Townsend and Crew LLP; Henry K. Woodward

[57] ABSTRACT

A structure and method for high density programmable logic device (PLD) testing, programming, and verification is disclosed. The device employs non-volatile memory cells, such as electrically erasable programmable ROM (EEPROM), as its programmable elements. The structure and method allow the PLD to work in the normal operation state and also in a number of utility states. In normal operation state, the PLD performs the configured logic function as programmed by the user. In utility states, the PLD can be programmed, verified and tested. A state machine and a decoder are used to perform these procedures. They include bit program (write), verify (read), bulk program (write all), bulk erase (erase all), checker board and inverse checker board program, cell current test, address decode test, softwrite test and logical function test data preload. All the utilities are in a serial algorithm and are controlled by an internal state machine, which needs as few as four dedicated pins to interface with the PLD proper. In cell current test state, an additional dedicated external pin is used to supply a control voltage to a floating gate transistor in order to control the cell current. Serial logic circuits are designed to meet this test requirement.

28 Claims, 17 Drawing Sheets

| I3 I2 I1 I0 | INSTRUCTION |
|---|---|
| 0 0 0 0 | Eraseall |
| 0 0 0 1 | Wrall |
| 0 0 1 0 | PGM |
| 0 0 1 1 | Decode |
| 0 1 0 0 | Sfwrt |
| 0 1 0 1 | CUR |
| 0 1 1 0 | Chk |
| 0 1 1 1 | Chkb |
| 1 0 0 0 | Inchk |
| 1 0 0 1 | Inchkb |
| 1 0 1 0 | VE |
| 1 0 1 1 | ASHF |
| 1 1 0 0 | Idecode |
| 1 1 0 1 | PRL |
| 1 1 1 0 | Reserved |
| 1 1 1 1 | Bypass |

FIG. 3

*See FIG. 15 for Verification Operation

TESTING STRUCTURE AND METHOD FOR HIGH DENSITY PLDS WHICH HAVE FLEXIBLE LOGIC BUILT-IN BLOCKS

BACKGROUND OF THE INVENTION

This invention relates to programmable logic devices, and more particularly, this invention relates to the testing, programming and verification of programmable logic devices which employ non-volatile electrically erasable programmable transistors.

Programmable logic devices provide flexible logic function architecture, which is user-programmable through on-chip fuses or switches, to perform specific functions for a given application. PLDs can be tailored to a desired logic configuration after being purchased by the customer.

Programmable logic devices can be programmed in different ways. One way is to use a special programmer such as the PDS-3 programmer (a machine manufactured by ICT, Inc.). When this method is used, signals are sent in parallel to the memory cells. In this situation no dedicated pins are needed for program and test. Another way is 'in-system' programming by which PLDs may be programmed after they have been installed as part of a larger assembly, e.g. after they have been assembled with other components on a printed circuit board. They may be reprogrammed without being removed from the board. They are programmed or erased through a small number of pins on the PLD device. An example of this method is the use of a JTAG interface. This interface is specified as the IEEE Standard Test Access Port and Boundary-Scan Architecture, in IEEE Standard 1149.1-1990. JTAG programming uses four dedicated pins on the PLD. Signals to these pins are typically TMS (test mode select), TCK (test clock), TDI (test data in), and TDO (test data out). This method avoids the alternative of having to use complex system sources for programming or erasing.

Generally, to guarantee quality and performance of a device, a number of test procedures should be performed before a programmable device is programmed for a specific application function. For memory-based programmable logic devices, tests usually include: memory cell current reading test, checker board test, address decode test, softwrite test and logic function test. In all memory-based devices, including EPROM, EEPROM and flash memory, configuration information is stored in the memory cell. This information is read out as current, which is amplified by a sense amplifier and converted to a voltage signal. If the current reading of a cell is too large, power consumption of the device will be too high. If the current is too low, the reliability of the device will be a problem and production quality control will be difficult. Because of the realities of fabrication, it is impossible that every chip of a device on a die will have the same memory cell current reading as specified by the design. The memory cell current test provides accurate data which reflect the actual status of memory cell operation.

In memory-based devices, memory cells are usually placed as an array of columns and rows, resulting in gates of adjacent cells being very close to each other. This structure makes it possible for adjacent cells to be short circuited. Checkerboard and Inverse Checkerboard tests can detect a short circuit by programming the cell array into certain check patterns and then verifying them.

A logic function test is usually done by programming a device in certain complex logic function circuits, such as an inverter or a counter, or a combination of several simple logic circuits. This facilitates functional testing of the device. The preloading of the registers allows direct loading of arbitrary states, making it unnecessary to cycle through long test vector sequences to reach a desired state. In addition, illegal states can be verified by loading illegal states and observing proper recovery.

Softwrite is a test condition in which low programming voltage and low Vcc are used. Some devices need to be tested under this condition in order to guarantee that a PLD device will work normally in a worst case scenario. This is done using complex test equipment and has disadvantages, such as increasing the complexity of the test procedure and slowing the test process. Special configuration memories and control circuits are designed to control the voltage and complement this test.

Address decoder test is important and is a regular test process for PLDs at the sorting and final testing phases. As PLD density increases, and as architecture becomes more complex, the number of address decoders increases greatly, and time for decoder test increases considerably. It is therefore expeditious to add a special Decode instruction and design a circuit to achieve on-chip decoder testing.

Different tests use different pins multiplexed between the test state and normal operation. Different tests use different internal circuit structures. Some tests require different external connections. It may be necessary to place the device in normal operation, programming and testing mode by applying several control signals separately to avoid signal contention on the device. It may also be necessary to apply a particular programming or erasing potential to the device, which potential may be different from potentials normally applied to the device. Consequently, a device with different test items requires more system resources for programming, verifying and testing. However, test could be considered as a series of combination operations of programming and erasing. It is desirable to implement the test functions in a programming structure by employing the in-system programmability through a port such as the JTAG port so that additional pins do not have to be used for applying other programming or erasing mode control signals and/or for applying special programming or erasing potentials, in order to avoid having to use more extensive system resources. With the testing and programming sharing the same programming structure, the states of the device can be switched easily. The application of the particular potential required by reading, programming and erasing can be controlled by the controller of the structure. The interface with external is very simple, which greatly reduces the external connections.

In view of the foregoing, it is an object of this invention to provide an improved testing compatible programming structure for the programming of programmable logic devices through a test port, such as a JTAG test access port.

It is another object of this invention to improve and simplify the testing of programmable logic devices by integrating the test function into the programming structure.

SUMMARY OF THE INVENTION

In brief, a structure and method for programmable logic device programming, verification and testing is presented. The device comprises an array of programmable memory cells, arranged as rows and columns, to store the configuration information. The programmable memory cells, such as floating gate transistors, are programmed either to the conductive mode or the non-conductive mode to provide the desired configuration. The device is operable in a normal operating state and in several utility states allowing programming, erasing, verification and testing functions to be carried out.

The device comprises an internal state machine to control the above states of the device. In the preferred embodiment, the conventional JTAG state machine is employed. The state of the device is dependent on the logic levels of external mode input signal TMS (Test Mode Select) and external serial data input signal TDI (Test Data Input), as well as on the present state of the machine state. The state machine is sequenced by external clock input TCK (Test Clock). By driving the TMS and TDI pins in the appropriate manner and sequence, the state of the device may be changed from a present state to the next state in accordance with these external signals and the present device state, as determined by the state machine equations.

The device integrates the test functions into the programming circuit structure. The device includes a column address shift register and a row data shift register whose length is the number of the memory cells in a column. In programming mode, the data in the row data shift register serve as programming data of the column selected by the address in the columns address shift register. In verification and test mode, the data in the row data shift register serve as row select data. The intersection point of the selected column and row designates the location in the memory cells array of the memory cell selected to be verified or tested. The read lines of every column are connected together and sent to the TDO (Test Data Output) through two switches. This allows logic levels testing and current testing of the selected memory cell to be carried out in the structure. When logic levels testing is required, a sense amplifier converts the output current of selected memory cell to logic level to be verified. In preload mode, all the registers in the device are chained together with TDI as the input data source. The preloading data are inputted from TDI, and arbitrary states of the complex state machine can be loaded.

A feature of the invention is a testing compatible and state machine controlled programmable logic device programming structure.

Another feature of the invention is the memory cell logic level and current testing in one structure.

Another feature of the invention is the address decoder test structure in the logic device.

Another feature of the invention is the soft write test which provides special test conditions to define a weak memory cell in a programmable logic device.

Yet another feature of the invention is instructions and structure for checkerboard test and inverse checkerboard test programming.

Still another feature of the invention is preloading the states of the registers in the device to enable the loading of arbitrary states to a complex state machine in function test.

BRIEF DESCRIPTION OF DRAWINGS

The above and further features of the invention, its nature and various advantages will be more apparent from the following accompanying drawings and the detailed description of the preferred embodiments.

FIG. 3 is a table containing the programming, verification and testing instructions, in accordance with the invention.

DETAILED DESCRIPTION OF THE PREFERRED EMBODIMENTS

The present invention comprises a structure for programmable logic device testing, programming and verification. In the following description, some specific details are set forth, such as shift register circuits, array cell circuits, instruction set and the like, in order to provide a thorough understanding of the invention. However, it will be obvious to one skilled in the art, that the present invention may be practiced without these specific details. In other instances, well-known circuit details are not described in detail so as not to obscure the invention.

Figure 1:
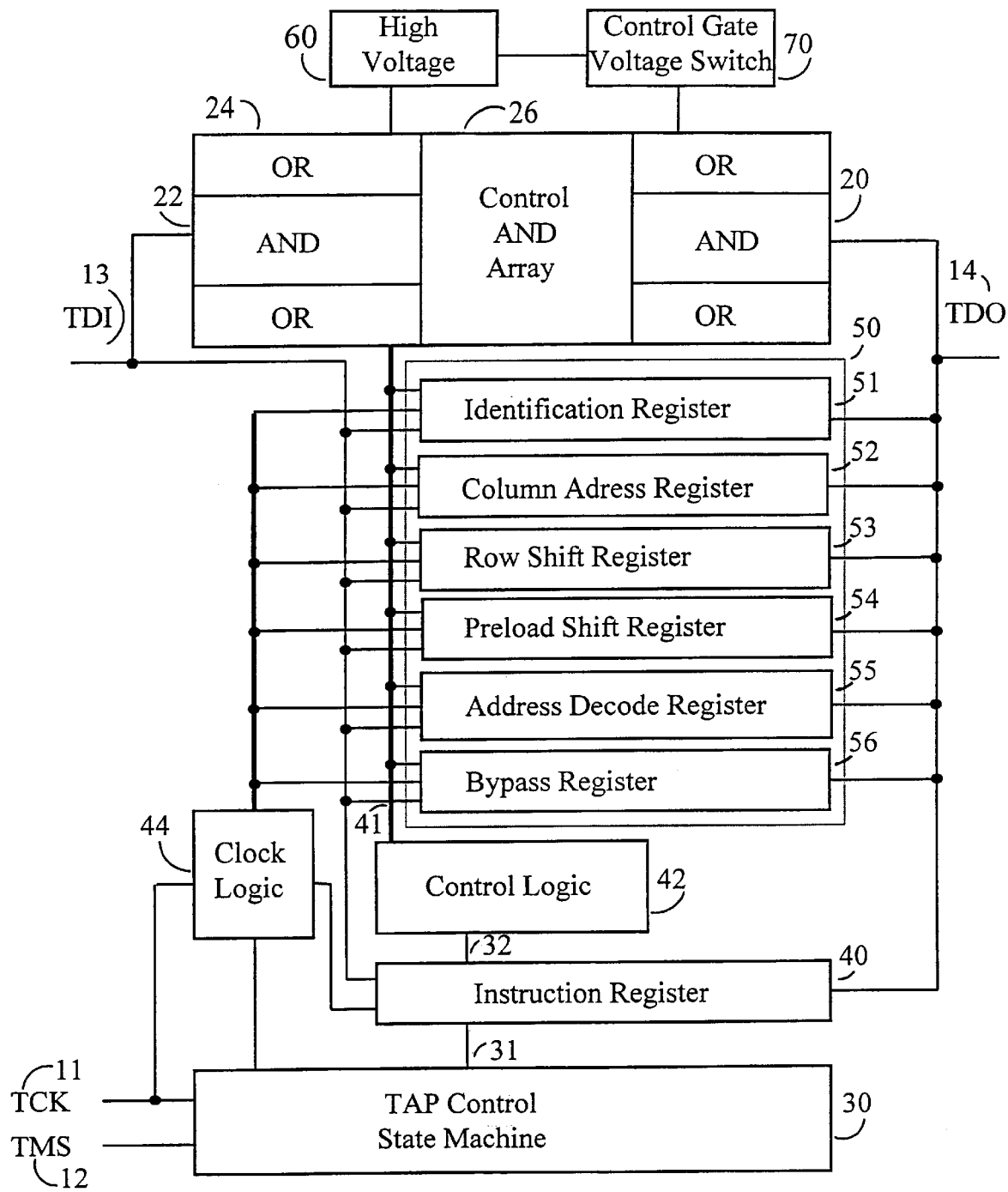
FIG. 1 is a simplified block diagram of the programmable logic device containing the testing compatible state machine controlled programming structure, in accordance with the invention.

Referring to FIG. 1, a simplified block diagram of the programmable logic device with a testing compatible programming structure is disclosed. Exemplary programmable Memory Cell Array 20 can be programmed, verified and tested though a simple interface which can be the conventional JTAG interface or other state machine interface. The logic programmable AND-OR array is logically an AND 22 gate array connected to an OR 24 gate array, with inputs to the AND array being programmable to provide a desired logic output from the OR array. The control AND array 26 is used to provide a universal control mechanism for the multi-register macro cells. This AND-OR array structure is discussed in application Ser. No. 09/007,445, filed Jan. 15, 1998 and assigned to ICT Corporation. This application is incorporated by reference. To simplify the explanation, a well-known JTAG interface is used in the present invention. The interface has as few as four dedicated external pins (TCK 11, TMS 12, TDI 13 and TDO 14), and internally, it consists of an instruction register 40 and a group of data registers which include Identification Register 51, Column Address Register 52, Row Shift Register 53, Preload Shift Register 54, Address Decode Register 55, Bypass Register 56. All these registers are controlled by a Control Logic 42. A Clock Logic 44 is used to control the synchronization of all the above registers. The device also contains a voltage multiplier 60 to generate, from the supply voltage, the high potential needed for writing and erasing. Control gate voltage switch 70 applies different potentials needed in different operation modes to the control gates of programmable cells. In normal function operation, the TAP controller is in reset state and all the circuits regarding programming, verification and testing are inactive, which enables the device to perform its user-defined normal function through normal operation I/Os.

Programmable logic devices may be any circuitry having transistors that require programming, and in which information stored is read through the converting of reading current. For example, Memory Cell Array 20 may be a Flash memory, EPROM or EEPROM based programmable logic device, or a programmable memory device. When it is desired to program, verify, or to test the device, the signals TCK 11, TMS 12 and TDI 13 are issued by the external programmer or tester, and the state machine 30 is sequenced in different controller states, in which proper instructions are shifted in, and proper data, according to the instructions, are also shifted in. The transistors to be programmed, verified or tested in a memory cell array are addressed by the Column Address Register 52 and Row Shift Register 53. At the same time, voltage multiplier 60 and control gate voltage are controlled by the instructions from an instruction register, in order to cause the proper programming potential to be applied to those transistors for the proper period of time. More detail regarding these kinds of operations is provided below.

Figure 4:
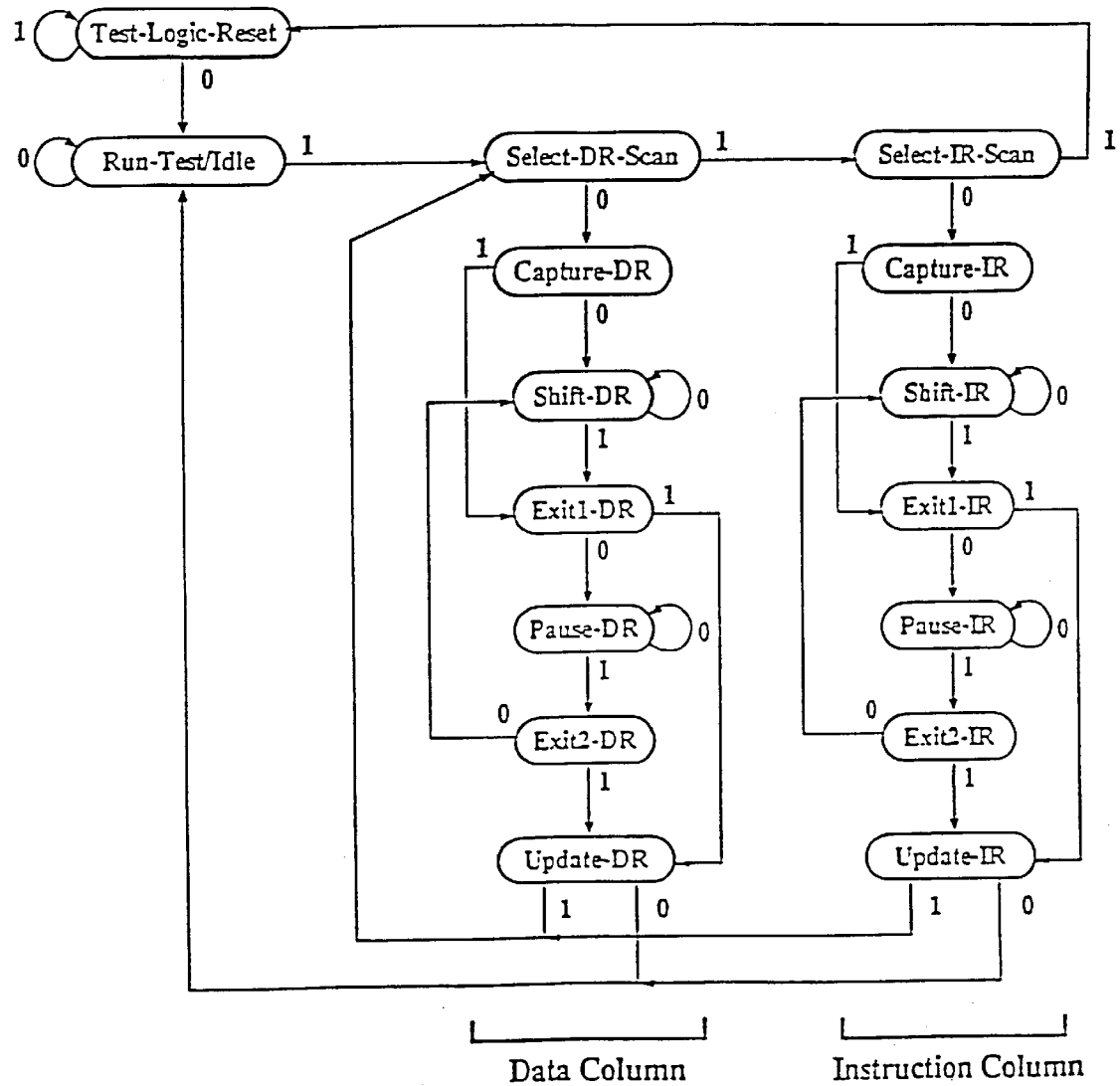
FIG. 4 is the JTAG TAP control state machine state diagram, which is well known in the art.

The state in state machine 30 (also shown in FIG. 4) changes from present state to next state at each TCK pulse, in accordance with the signal level and present state of the state machine. State Machine 30 changes its present state to next state in accordance with the level of the TMS signal and the present state at the time of the TCK pulse. State Machine 30 begins operating in the reset state. When state machine 30 gets a TCK pulse from external apparatus, it either remains in its present state or changes to a new state. Through a sequence of TMS signal values synchronized with the TCK signal, any of the its states can be accessed. State Machine 30 produces the state control output signal 31 through a selfcontained state decoder. The control output signals 31 include signals such as CK_IR (clock instruction register), Shift_IR (shift instruction register), Update_IR (update instruction register), CK_DR (clock data register), Shift_DR (shift data register), Update_DR (update data register), and Select (select between instruction operation state and data operation state).

In FIG. 1, when state machine 30 is in instruction shift state, instruction register 40 receives the CK_IR, Shift_IR, Update_IR, and TDI signals as inputs. The signal which is applied to the TDI input terminal shifts in the instruction register bit by bit, in response to each CK_IR signal pulse. After the instruction register 40 is filled with the desired instruction data, they are latched in and decoded by the Control Logic 42. The control signals decoded from control logic 42 are applied, via instruction control bus 41, to all the registers 51–56. Memory Cell Array 20 controls data flow path and system operations in different modes.

FIG. 1 also shows how the registers used for programming, verification and testing in the device are organized and how the data flow through these registers is controlled by the instructions. The input terminals of all the registers are connected together, and share the common data input TDI 13. Register 40 is the above mentioned instruction register used to shift in the instructions. Register 51 is used to load and shift out the identification code permanently stored in the correspondent device to identify the device. Register 52 represents the register used to shift in the column address, for the column accessing of the programmable memory cell array. Register 53 is the row select data register, which, in programming operation, serves as row data register, while in verification or cell current operation, serves as the row select register to activate the row to be verified or tested. Register 54 is constructed by getting all the functional registers of the device chained together to form a shift register, to enable the functional test preload data to be shifted in through TDI 13. When in normal operation, these registers are the function registers of the device. Register 55 is constructed with seven shift registers and six high voltage drivers, which serve as an address decode register to set the column address in a special pattern to check the column decoder. Register 56 is a one-bit bypass register that is conventionally provided in JTAG devices, and may be connected in series to allow data to pass through the device from TDI 13 to TDO 14, with only a one-bit delay. In verification and testing modes, programmable Memory Cell Array 20 functions as such a special register that it receives programming data from the row data shift register, but outputs verification and testing results directly to the TDO 14. Other outputs of the registers are also connected to TDO 14 through multiplex switches controlled by associated instructions, to guarantee that there is only one output to TDO 14 at any time. The signal selection is decoded as different values, depending upon whether the state machine is in the data column or the instruction column. The instruction path or data path is put through to TDO 14 in data operation states or in instruction operation states, respectively.

Figure 2:
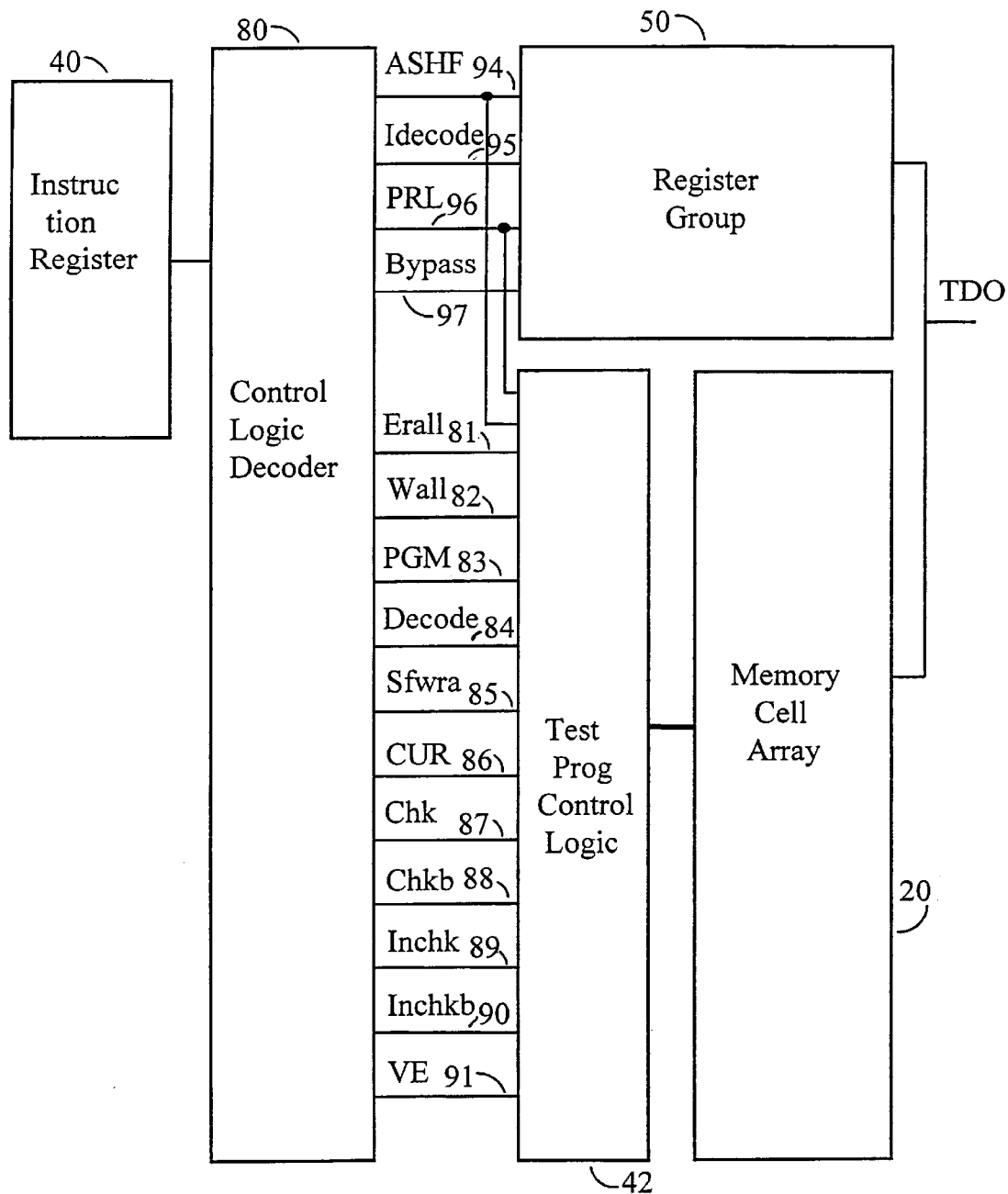
FIG. 2 is a testing structure diagram illustrative of programming, erasing, verification, cell current measuring etc. related to the testing procedure, in accordance with the invention.

All the test instructions, including logic control decoder and test program control logic are shown in FIG. 2. Their corresponding binary codes are listed in the table in FIG. 3. In the programmable logic device test, it is necessary to test not only the general program capabilities, such as erase all (Erall) 81, write all (Wrall) 82, program bit by bit (PGM) 83, but also to test other special program patterns. This means that at the first row, the even columns are programmed and at the second row the odd columns are programmed and so on. This test process is known as checkerboard (Chk) 87. At the inverse checkerboard (Inchk) 89, the opposite occurs, i.e. at the first row the odd columns are programmed and at the second row the even columns are programmed and so on. The test includes Decode 84 which tests the column decoder, the soft write (Sfwra) 85 which tests the program capability in a worst case situation, the CUR 86 which measures the memory cell array current. Idecode 95 is an instruction used to read out identification code stored in the device. Instructions such as PGM 83, Wrall 82 and Erall 81 are used to control all aspects of programming, bulk writing and bulk erasing operation. ASHF 94 is an instruction to control the shifting in one of the column addresses to select the column of the programmable circuits in the programming, verification and testing process of the device. Verification (VE) 91 is the instructions related to the operation of device configuration verification. CUR 86, Chk 87, Chkb 88, Inchk 89 and Inchkb 90 instructions, which are a feature of the invention, are employed to facilitate the testing operations. The various aspects of the programming, verification and testing functions of the device are controlled and accomplished by the above instructions, as well as by their combinations, which will be discussed in more detail below.

Figure 5A:
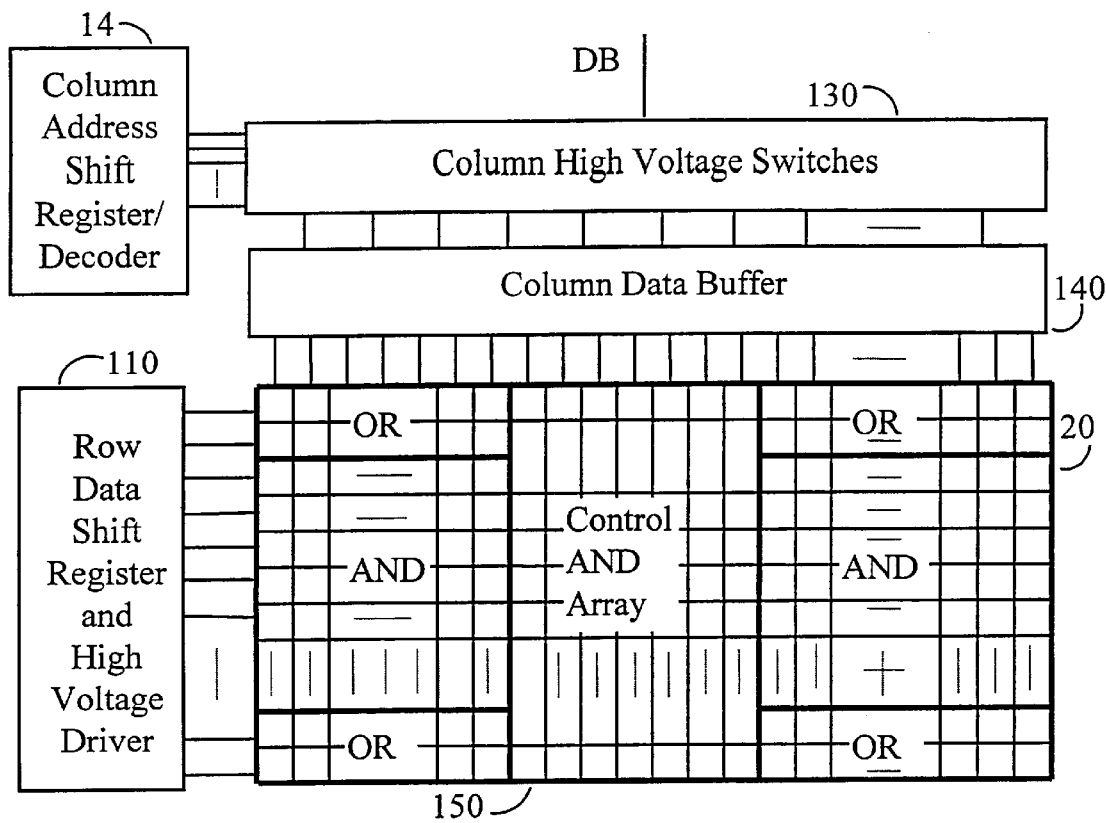
FIG. 5A is a simplified diagram showing location and addressing of memory cell array arranged as rows and columns in the programmable logic device, in accordance with the invention.

In order to test programmable memory cell Array 20, the various programmable memory cells locations in this array are addressed. FIG. 5a shows the locations of memory cells in a general programmable Memory Cell Array 20 and the logic blocks related to the addressing process. The programmable Memory Cell Array 20 may consist of any type of programmable memory cell, such as EPROM, EEPROM and FLASH memory cells. The programmable memory cells could be arranged in different logic blocks to perform the different device physical structure requirements and application requirements, such as AND array, OR array and PIA array. From the programming, verification and testing point of view, the memory cells can be thought of as an array of columns and rows of memory cells. Each memory cell location can be considered as being effectively at the intersection of a row location and column location 150.

Figure 5B:
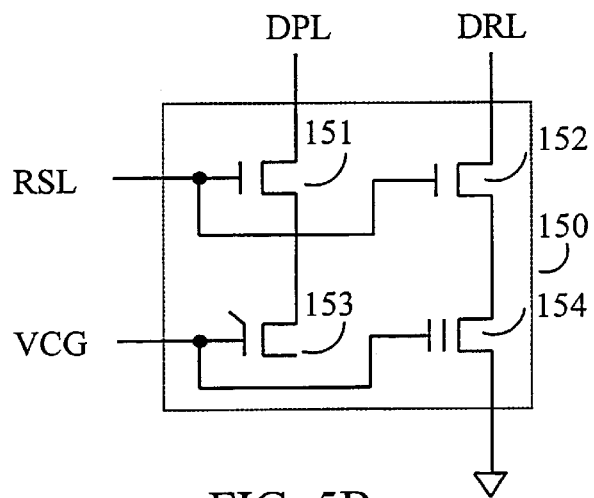
FIG. 5B is a schematic structure of the memory cell in the programmable logic device.

In the preferred embodiment illustrated in FIG. 5a, four transistor floating gate EE memory cells 150, whose structure is shown in FIG. 5b, are employed as the memory cells of the programmable Memory Cell Array 20. Two high voltage switch transistors 151 and 152 serve as select gates and another two transistors 153 and 154 are floating gate transistors. DPL is data programming line and DRL is data reading line. RSL is row select line. VCG is control gate voltage of the memory cell. This cell has two characteristics: (1) separated reading path DRL and writing data path DPL make the logic structure design of the programmable logic device more simple. (2) the reading current of the cell is quite large, so that the circuits of the readout sense amplifier are relatively simple and may react at high speed. The cells in the programmable Memory Cell Array 20 are connected in such a way that all the RSLs of the cells in same row are connected together, and all the VCGs of the cells in the memory cell array are also connected together. When programming or erasing the memory cells, the DPL and VCG are set to different voltages to properly program or erase the memory cells.

Logic block 110 includes the row data shift register and high voltage driver. The row select data corresponds to a specific row in the shift register and controls the high voltage driver related to this row, to supply different potentials in different operation modes. Logic block 120 serves as column address shift register and column decoder. The address to be accessed in the column in the Memory Cell Array 20 is shifted in the register, and decoded to control the column high voltage switches 130. The high voltage to be applied to a memory cell in the programming operation is sent to the selected column through these switches. The output voltages or currents from the selected memory cells in the verification or testing operation are also sent out through these switches. Column data buffer 140 is used to merge the reading and writing data paths of the memory cell column into single bit line (BL). A more detailed description of the function of these logic blocks will be found below.

Figure 6:
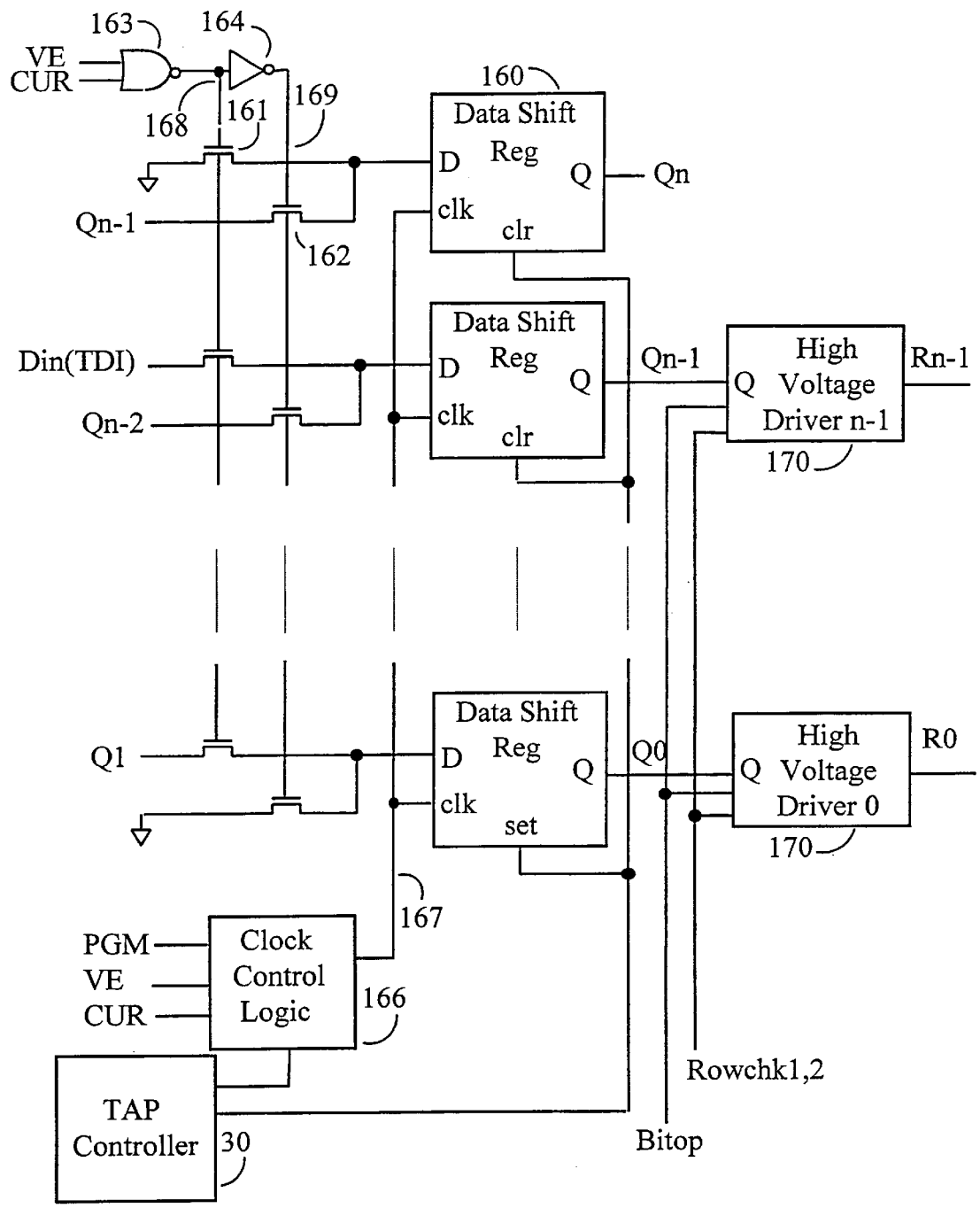
FIG. 6 is a schematic structure of row data shift registers and includes data shift registers and high voltage drivers.

FIG. 6 is a more detailed block diagram of the row data shift register and high voltage driver. The row select operations of programming, verification and testing can be accomplished in this circuit which is controlled by the instructions. A number of registers 160 are serially connected together to form the shift register, the length of which is the number of the rows of the programmable Memory Cell Array 20, plus 1. Every row has a corresponding register. The clock signal 167 to the registers is controlled by clock control logic 166 in such a manner that only in programming (PGM=1) or verification (VE=1) or cell current testing (VUR=1) operation, and with the TAP control state machine 30 in shift data register state (shift_DR=1), can the clock be applied to 167. The path data shifting is controlled by gates 163 and 164. In programming operation, select signal 168 is high, all of the nmos switches 161 are turned on. This connection causes the shift register to shift the data from top to bottom, with the data source shifted in from Din at the data terminal of the data shift register n−1. The data of the selected column are shifted in from Din which is logically connected to TDI. After all the data of a column are shifted in, they are sent to the high voltage drivers, with one bit corresponding to one row. Through the high voltage drivers, these data can determine which row of the data is to be selected to do program and test. In the verification or cell current testing operation, the selected signal 169 is high, which makes all the nmos switches 162 turn on. This connection causes the shift register to shift the data from bottom to top. Before every shifting, a Capture_DR from TAP Control State Machine 30 is applied to clear or set terminals of the register 160 (Reg0 is set and all other registers are clear). The shift register has an initial state with Q0=1 and all other outputs of the registers as 0. In the process of shifting, the "1" in the bottom of the register is shifted a bit up at one clock of the shifting till it reaches the top of the registers. With a "1" on a bit position selecting a row of the array, the above shifting causes one of the rows, from bottom to top, to be selected at every clock, for verification or cell current testing.

The Q0–Qn−1 signals are sent to High Voltage Drivers 170 which are controlled by Rowchk1, Rowchk2 and Bitop. The structures of the two adjacent High Voltage Drivers 170 are the same, the only difference between the two drivers is that the odd drivers are controlled by Rowchk1 signal and the even drivers are controlled by Rowchk2 signal. In checkerboard testing operation, the checkerboard code writing is effectively done by simply pulling down odd High Voltage Driver 170. The Bitop (=PGM+VE+CUR) control the High Voltage Driver's logic value which is determined by the outputs of the shift register when in programming (PGM=1), verification (VE=1) or cell current testing (CUR) operations. When the operation needs writing (PGM, Wrall, Chk, Chkb, Inchk or Inchkb), the logic turns the high voltage Vpp on or off to control the selection of the row to be written to. While in an operation which does not need writing (VE or CUR), the logic value goes directly to control the selection of the row to be read.

Figure 7:
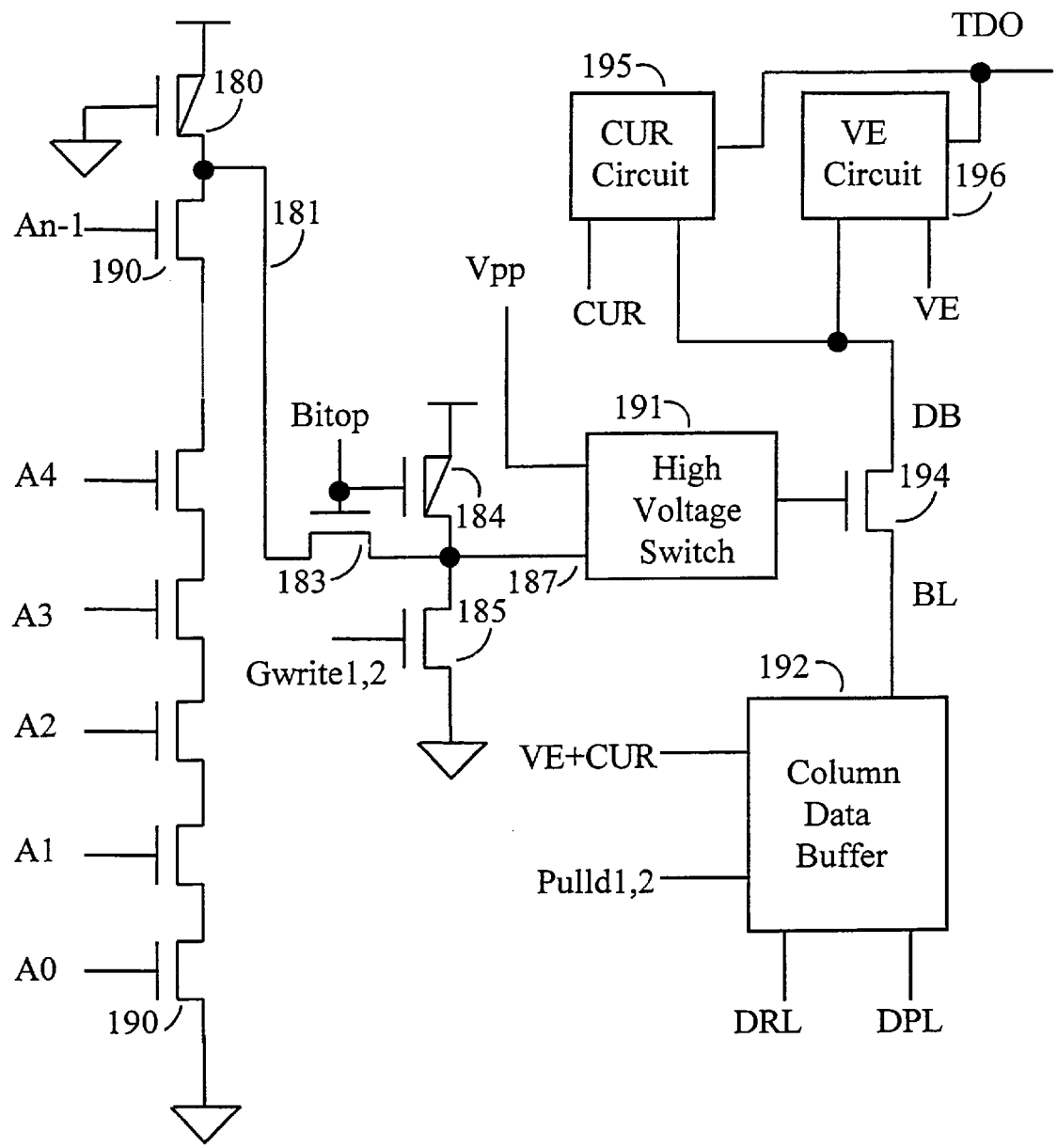
FIG. 7 is a simple structure of a column address decoder, column data buffer, cell current and verify function of the programmable logic device.

The above description discusses the selection of the row in the programmable array. FIG. 7 is a block diagram of the column decoder showing clearly the mechanism of the column selection in different operations. With a different column address (A0–An−1) being applied to the transistors 190, all serially connected pull down transistors 190 of the decoder turn on, and net 181 is pulled down. As a result, the output of the transistor 183, serves as the control signal of High Voltage Switch 191 to switch on or off the connection transistor 194 between DB and the Bit Line (BL) of the selected column. When in Bit Operation (Bitop: PGM, VE or CUR), nmos transistor 183 is on and pmos transistor 184 is off, the column connection of the cells is selected by the decoder through 191. When in none Bit Operation mode, all the nmos transistors 183 are turned off and all the pmos pull up transistors 184 are turned on. This causes all the columns of the array to selected. This kind of selection is required by some operations such as write all. In checkerboard writing operation (also a none Bit Operation) besides the pmos transistors being turned on, one of the gwritex (x=1 or 2) is turned on also in the checkerboard instruction. Because the pulling down of 185 is stronger than the pulling up of 184, the control signal 187 will finally be pulled down by the pmos transistor 185. Because only half of the nmos transistors 185 (even transistors or odd transistors) are turned on, as determined by the specially designed circuits, the Bit Lines (BL) of this half of the columns (the even columns or the odd columns) are connected with DB for checkerboard pattern code writing.

FIG. 7 also shows the structure diagram of the data buffers 192 used to merge the reading path DRL and writing path DPL of a column of memory cells in the array into a single bit line BL. Because of the structure of the memory cells employed in the preferred embodiment, every column of the memory cells in the array has two separate paths, one for reading (DRL) and one for writing (DPL). To make the data to be programmed or to be verified manageable, it is necessary to merge the two data paths into one. Every column has a column data buffer. When in verification (VE=1) or cell current testing (CUR=1) operations, the memory cells are in reading operation, and the reading path DRL is connected to BL to send the read data out. When not in the reading operation, DRL is pulled down. In those operations which need writing process (PGM, Writeall, Chk, Chkb, Inchk or Inchkb), high voltage Vpp is applied to the DPL to program the memory cells. The high voltage required for the writing is transferred from BL to DPL. At the same time, in checkerboard writing operation, any one of the signals in Pulldx (x=1 or 2) is high, and as a result, the even columns or odd columns are on, to pull the connected writing path down for the checker board writing operation.

A current and voltage data buffer 195, 196 are shown on FIG. 7. After program or erase, the current from memory cells will be turned on or turned off. The signal from a memory cell is current. In the verification state (VE) the current signal is converted by VE Circuit 196 to a voltage signal and this logic signal is sent out for verification. A sense amplifier is used to transfer the current signal to a voltage logic signal. The decode signal (1010) is used to set the verification state (VE) The decode signal (0101) is used to set the current state (CUR). In the current state (CUR), the memory cell current passes through the CUR Circuit, and goes directly to an output pin.

Figure 8:
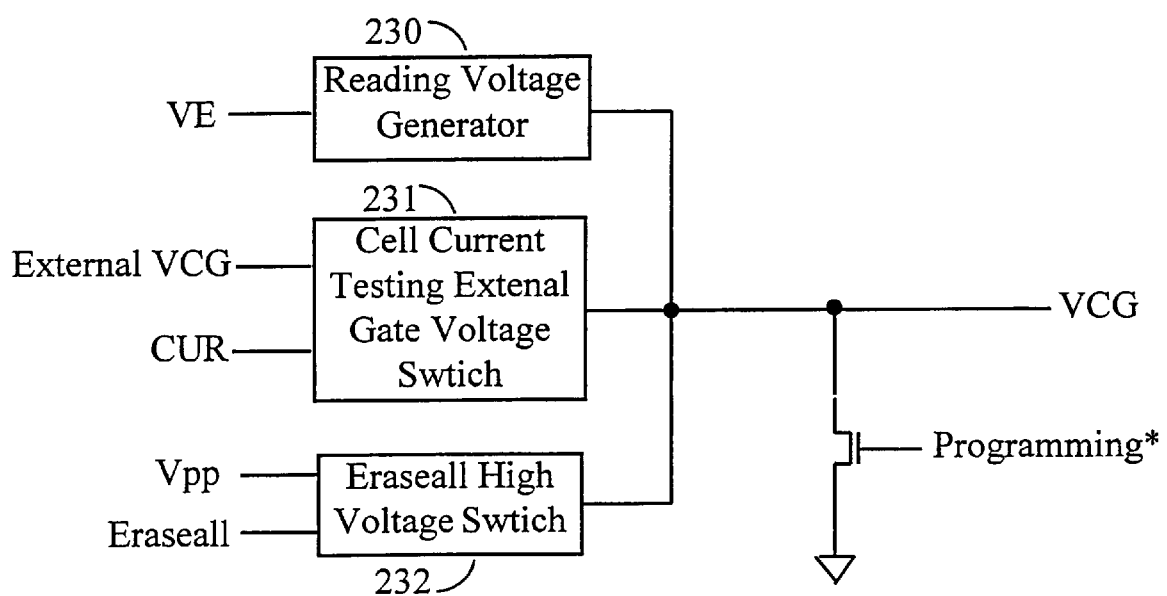
FIG. 8 is a simplified schematic illustrative of the control gate voltage switch of the programmable logic device in accordance with the invention.

FIG. 8 shows another aspect of the circuit controlled by the various instructions, the Control Gate Voltage (VCG) switch, which switches the potentials of the VCG according to the instructions being executed. The employed memory cell in the preferred embodiment requires different voltage to be supplied to its control gate when in different operations. When in verification operation, the VE signal drivers Reading Voltage Generator 230 generates a voltage suitable for reading on VCG. When in cell current testing operation, controlled by signal CUR, an External Control Gate Voltage is switched to VCG through the Cell Current Testing External Gate Voltage Switch 231, which enables the external control of the control gate voltage in the current testing process. Eraseall operation requires a high voltage to be applied to VCG. This is done by controlling Eraseall High Voltage Switch 232 to let in the high voltage Vpp when in Eraseall operation. When a writing operation (PGM, Wrall, Chk, Chkb, Inchk or Inchkb) is executed, pull down transistor 233 is on and pulls the VCG to around 0 volts, which is required by memory cell writing.

Figure 9:
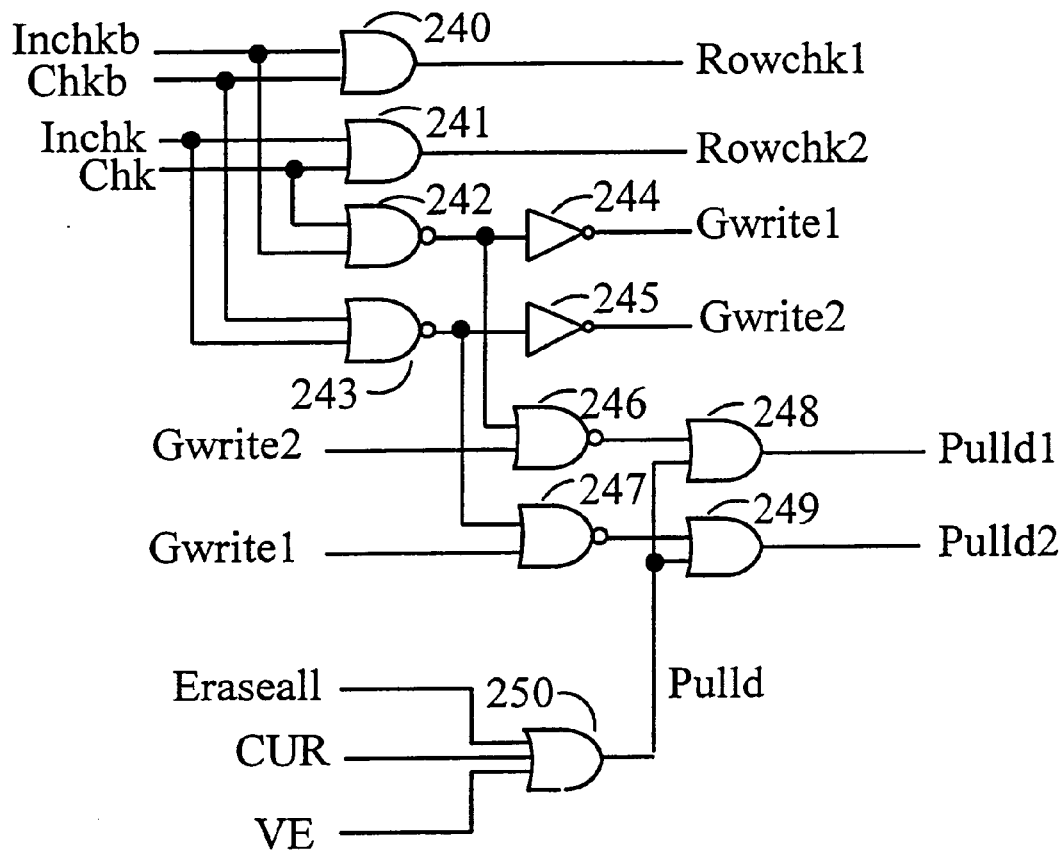
FIG. 9 is a simplified schematic illustrative of the control signals related to checker board and reverse checker board code writing of the programmable logic device in accordance with the invention.

The above description reveals that there are three circuits which involve the checkerboard testing: high voltage driver (row select), column decoder and column data buffer. FIG. 9 shows the schematic diagram of the control logic of the checkerboard operations. There are four checker board operations: Chk, Chkb, Inchk and Inchkb, which check different checkerboard patterns. The control signals Rowchkx (x=1 or 2) are generated by gates 240 and 241 to control the row selection of the intended checker board pattern, and selects either even or odd rows for programming. Both Gwritex and Pulldx (x=1 or 2) are used to control the selection of the columns. Gwritex (x=1 or 2), generated by gates 242–245, control the selection of the columns of intended checkerboard pattern, and selects either even or odd columns for programming, while Pulldx (x=1 or 2), generated by gates 246–249, pull down all the columns which are not selected by Gwritex (x=1 or 2). When in Eraseall (Erall) or Cell Current (CUR) testing or verification operation, with pulld=1, gates 248 and 249 are masked by the output of gate 250, and the Pulldx (x=1 or 2) are all active and pull down the writing lines of all the columns. The following table shows the instructions and their control logic values in accordance with the shown schematic:

|        | Rowchk1 | Rowchk2 | Gwrite1 | Gwrite2 | Pulld1 | Pulld2 |
| ------ | ------- | ------- | ------- | ------- | ------ | ------ |
| Chk    | 0       | 1       | 1       | 0       | 1      | 0      |
| Chkb   | 1       | 0       | 0       | 1       | 0      | 1      |
| Inchk  | 0       | 1       | 0       | 1       | 0      | 1      |
| Inchkb | 1       | 0       | 1       | 0       | 1      | 0      |

Note: all the values are based on the assumption of pulld = 0.

Figure 10:
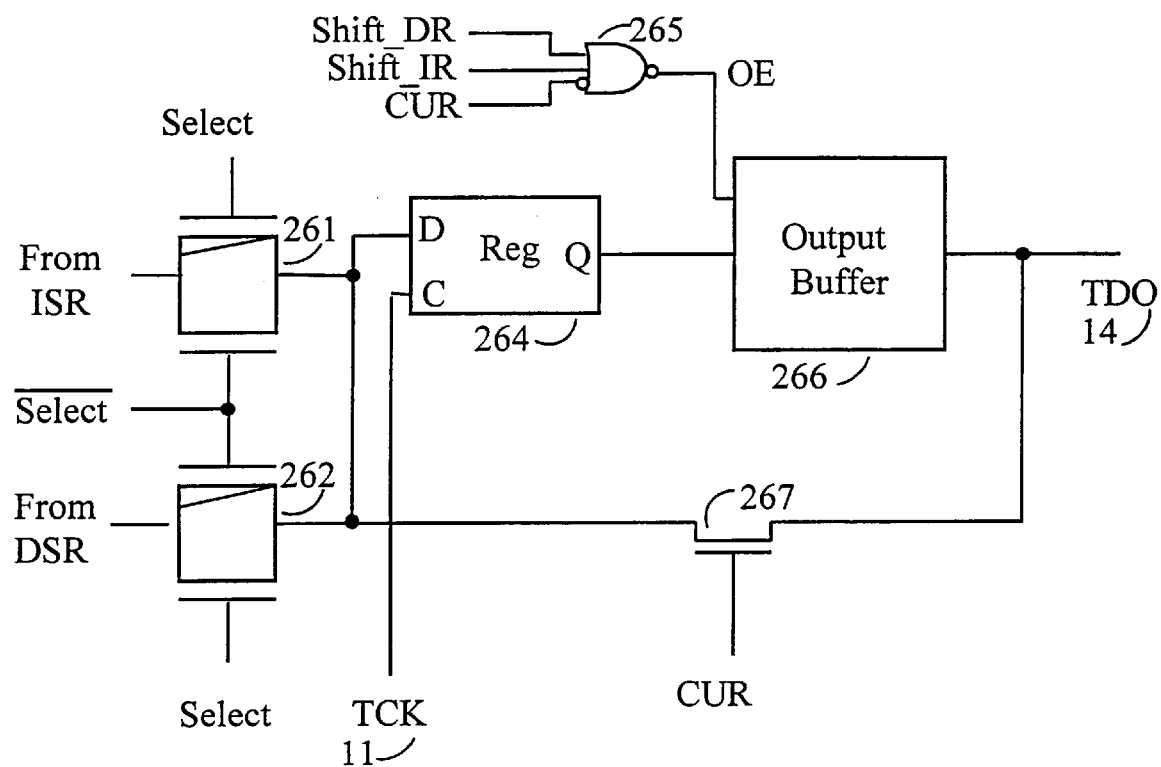
FIG. 10 is a simplified structure of test data output (TDO) buffer of the programmable logic device.

FIG. 10 show the schematic of Test Data Output (TDO) buffer. The instruction register signal (ISR) or data shift register signal (DSR) is selected by a select signal using switch 261, 262 and sent to register 264. The signal is sent out according to each TCK pulse. The output enable is controlled by Output Enable signal OE 265 which equals Shift_DR+Shift_IR+CUR. The current signal CUR does not go through Output Buffer 266 and passes directly through CUR transistor 267 to TDO 14.

Figure 11:
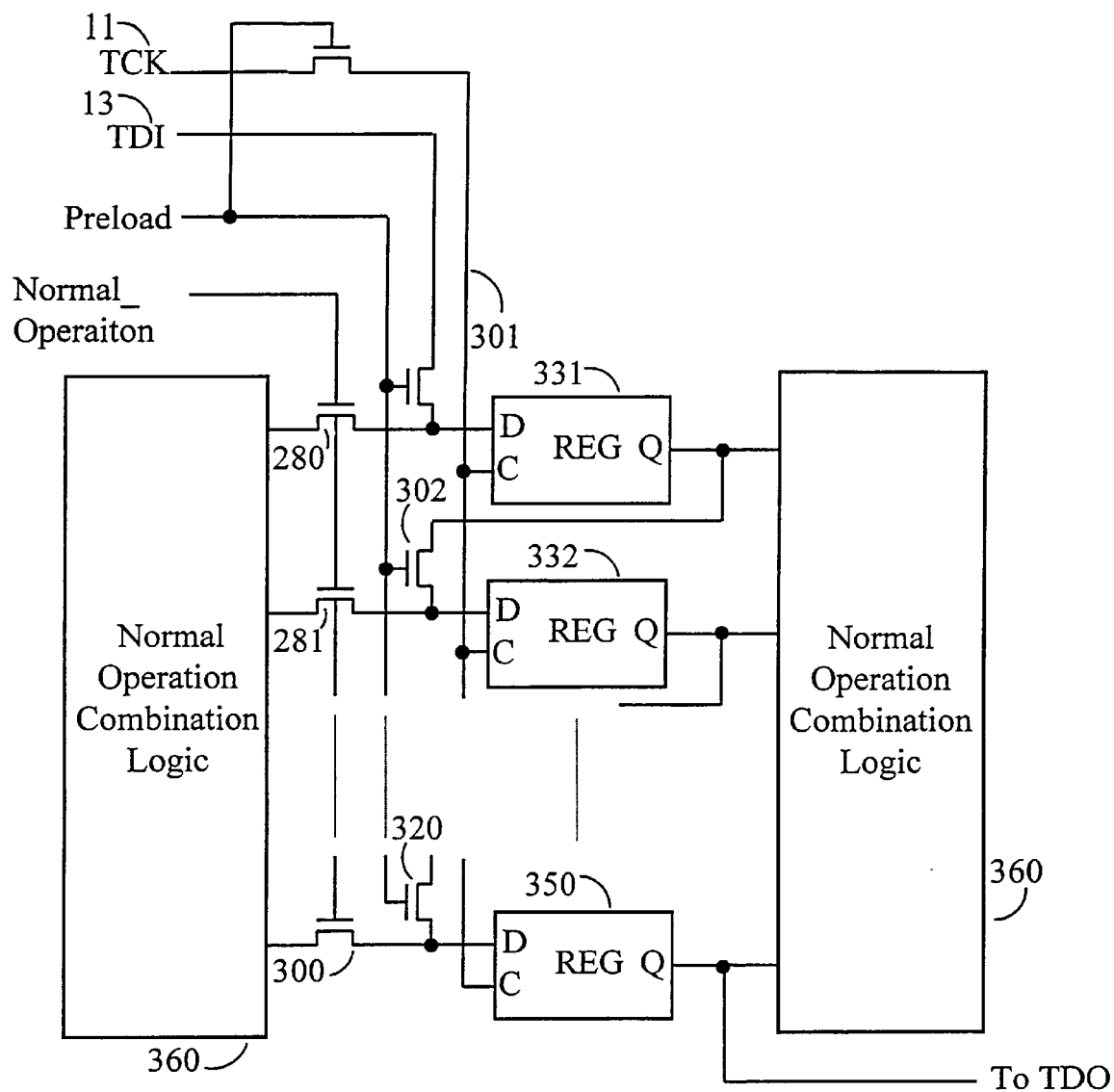
FIG. 11 is a simplified schematic illustrative of registers preloading of the programmable logic device, in accordance with the invention.

The test structure also supports functional testing, which is done by programming the device into a complex state machine and preloading the registers on the device to set the state machine 30 into an expected state. FIG. 11 shows the preloading view of the device. All the functional registers 331–350 of the device are chained together to form a shift register (Register 54 in FIG. 1) to enable the functional test preload data to be shifted in through TDI 13. When in normal operation mode, switches 280–300 are turned on, and the serial switches 301–320 are turned off. All the functional registers 331–350 are connected to Normal Operation Combination Logic (NOCL) 360 to perform the configured function. When in preloading mode, switches 280–300 are turned off and 301–320 are turned on. The registers 331–350 are disconnected from NOCLs 360. The resulting circuit has a serial input from TDI 13 and a serial output from TDO 14. Under the control of the TAP state controller and Instruction Register, the expected preloading data are shifted into the appropriate registers for functional testing.

Figure 12:
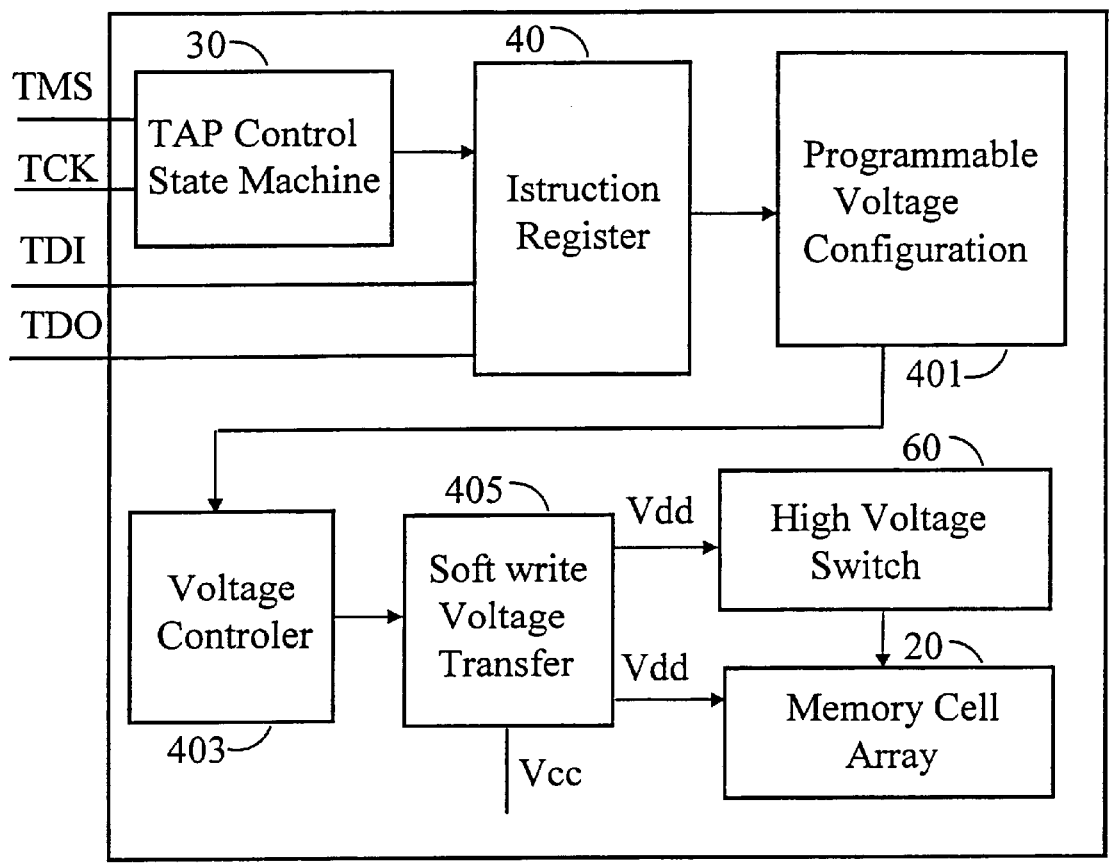
FIG. 12 is a simplified block diagram of soft write assignment, programmable voltage configuration, voltage controller and soft write voltage transfer, in accordance with the invention.

FIG. 12 shows a simplified structure of softwrite. A special configuration memory is designed to control the voltage. This memory will turn on or off under the control of the state machine, which is shown on instruction table (FIG. 3B). This internal potential controller reduces the risk of damage to the device, because these special programming and erasing potentials are only used during the period of programming or erasing. A Programmable Voltage Configuration 401 is used to store the information of the desired softwrite voltage. The TAP Control State Machine 30 and Instruction Register 40 are used to give the softwrite instruction to the Programmable Voltage Configuration 401. A Voltage Controller 403 interprets this information, and sends the voltage control signal to Softwrite Voltage Transfer 405. Each device is tested and measured to determine the desired softwrite voltage. This voltage is stored as a programmable voltage configuration before being used. When testing the softwrite condition, the device checks the programmable voltage configuration, to get information as to the voltage and switches the Vdd to that voltage.

Figure 13:
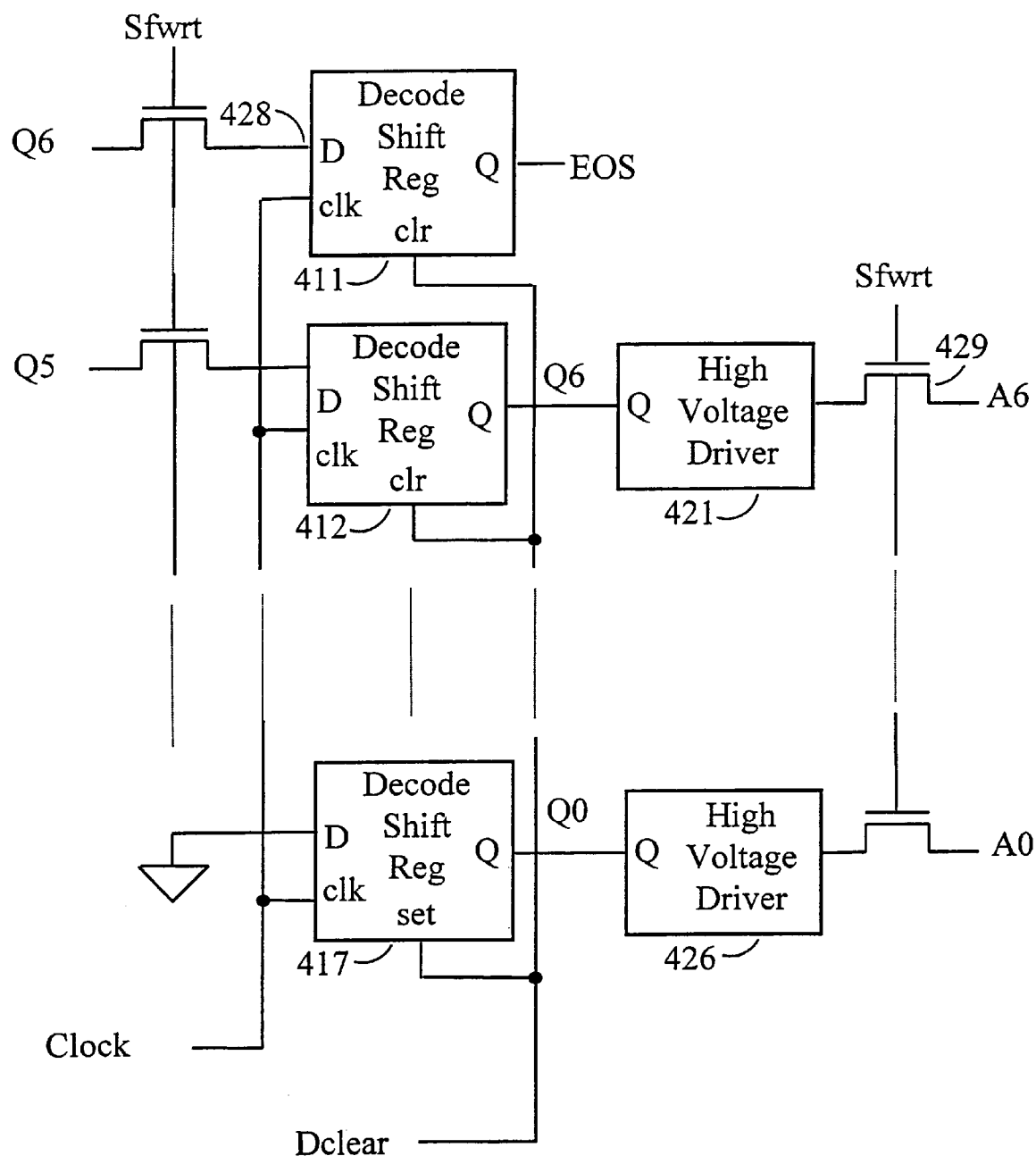
FIG. 13 is a simplified schematic diagram of address decode shift register employed in the test of programmable logic device of FIG. 2, in accordance with the invention.

FIG. 13 shows the Address Decode Shift Register for the column decoder. At Decode step, the Row Shift Register is set to pattern 1000 . . . 000 state (FIG. 6). Then the Decode Shift Register adjusts to a different state. In the initial state, the Dclear signal sets the Decode Shift Registers (411–417) to 1000000. The signals from these registers drive the High Voltage Drivers (421–426) to corresponding high or low voltages. At Softwrite (Sfwrt) step the transistors 428 turn on, then for each clock pulse, the '1' logic will shift up one step to make the Decode Shift Register (411–417) become 0100000, then 0010000 until 0000001. Finally, the "1" arrives at Q6 and sends EOS (End of Shift) signal to the state machine 30 to switch the device to another test step. Transistors 429 are turned on only at soft write. At other stages they turn off to isolate these circuits from column address shift register 52.

Figure 14:
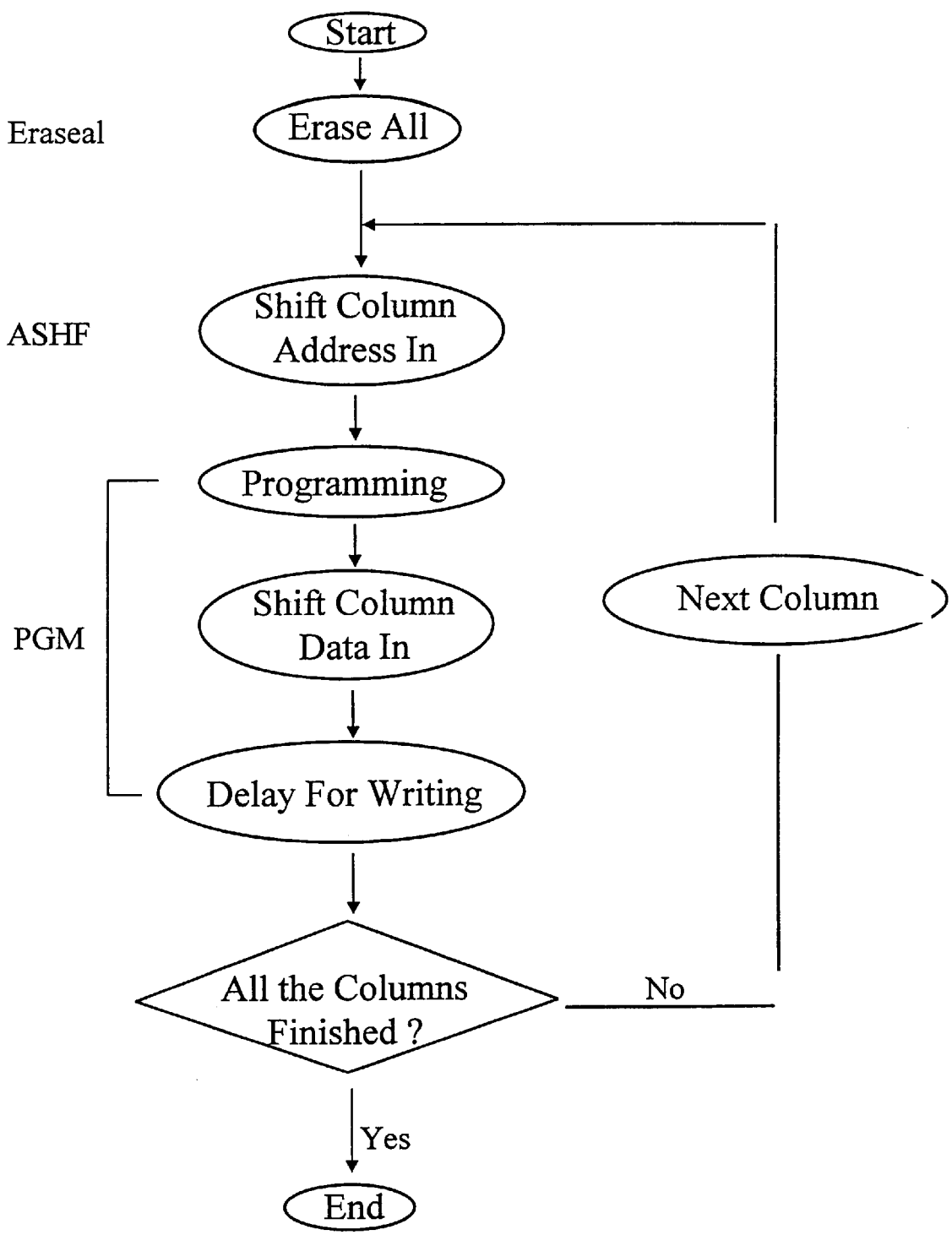
FIG. 14 is a programming flow chart illustrative of a typical programming sequence, in accordance with the invention.

FIG. 14 shows the flow chart of memory cell programming procedure which is described as follows:

1. Start, get the device well-prepared for programming.
2. Erase all memories cells. A typical programming sequence is entered from TMS to state machine 30. In accordance with TMS, the state machine 30 is placed in its SH_IR state. The state machine applies CK_IR and SH_IR signals to instruction register 40. The CK_IR signal is TCK signal that state machine 30 has received. This CK_IR signal will shift the instruction from TDI input terminal to the instruction register, in response to each CK_IR signal pulse. When all instruction data fill the instruction register 40, the state machine 30 is changed to UP_IR state to latch in the signal and decode the instruction data it has received. In order to erase all memory cells, the Instruction Register Decoder 80 gives the code 0000 (Erall). At this instruction all VCG will be set to high voltage Vpp and DRL and DPL will be zero volts. This condition erases all memory cells simultaneously.
3. The state machine goes back to shift state again and sets the instruction register to the Address Shift (ASHF) state. This instruction will shift the present address to Column Address Shift Register and Column Decode 120, to chose the column to be programmed.
4. Programming. By shifting in PGM instruction, the device goes into programming mode. At this step the device does the following:
5. Shifts in column data into the Data Shift Register 160.
6. Writes all the column data into memory cells at the same time. The TMS sets enough delay time (2–10 ms for example) for this write process.
7. Goes back to step 3 to circle the above operation until the last column of the memory cell array in the device is processed.

Figure 15:
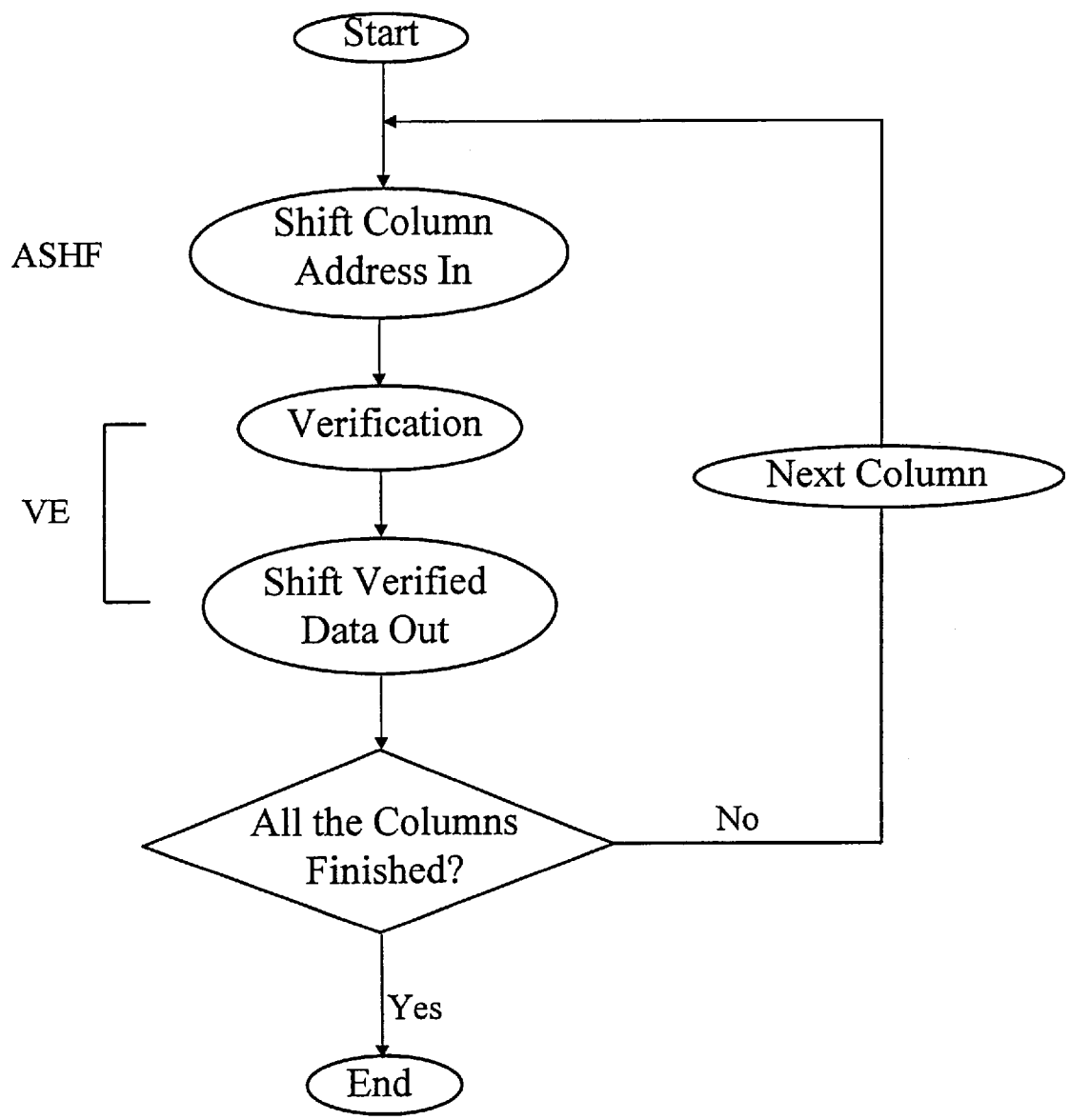
FIG. 15 is a verification flow chart illustrative of a typical verification sequence, in accordance with the invention.

FIG. 15 shows the flow chart of verification procedure.

1. Start, get the device prepared for verify.
2. Shift column address in. The state machine goes to shift state and sets the instruction register to the Address Shift (ASHF) state. The ASHF instruction shifts column address in and chooses one column to be verified.
3. Verification step. A Capture_DR from TAP control state machine 30 is applied to clear or set terminals of register 160. The shift register has an initial state, in which Q0=1 (FIG. 6) and all other outputs of the registers are '0', in order to read the bottom memory cell data at this column and then send the data out to TDO 14 through Verify Circuit (VE) 196.
4. Shift verified data out. The '1' shifts up one register at one clock of the shifting and the corresponding row is selected separately. The '1' will continually shift up until it reaches the top line, so the whole column of memory cells will be read out.
5. Go back to step 2 to circle the above operation until the last column of the memory cell array in the device is processed.

Figure 16:
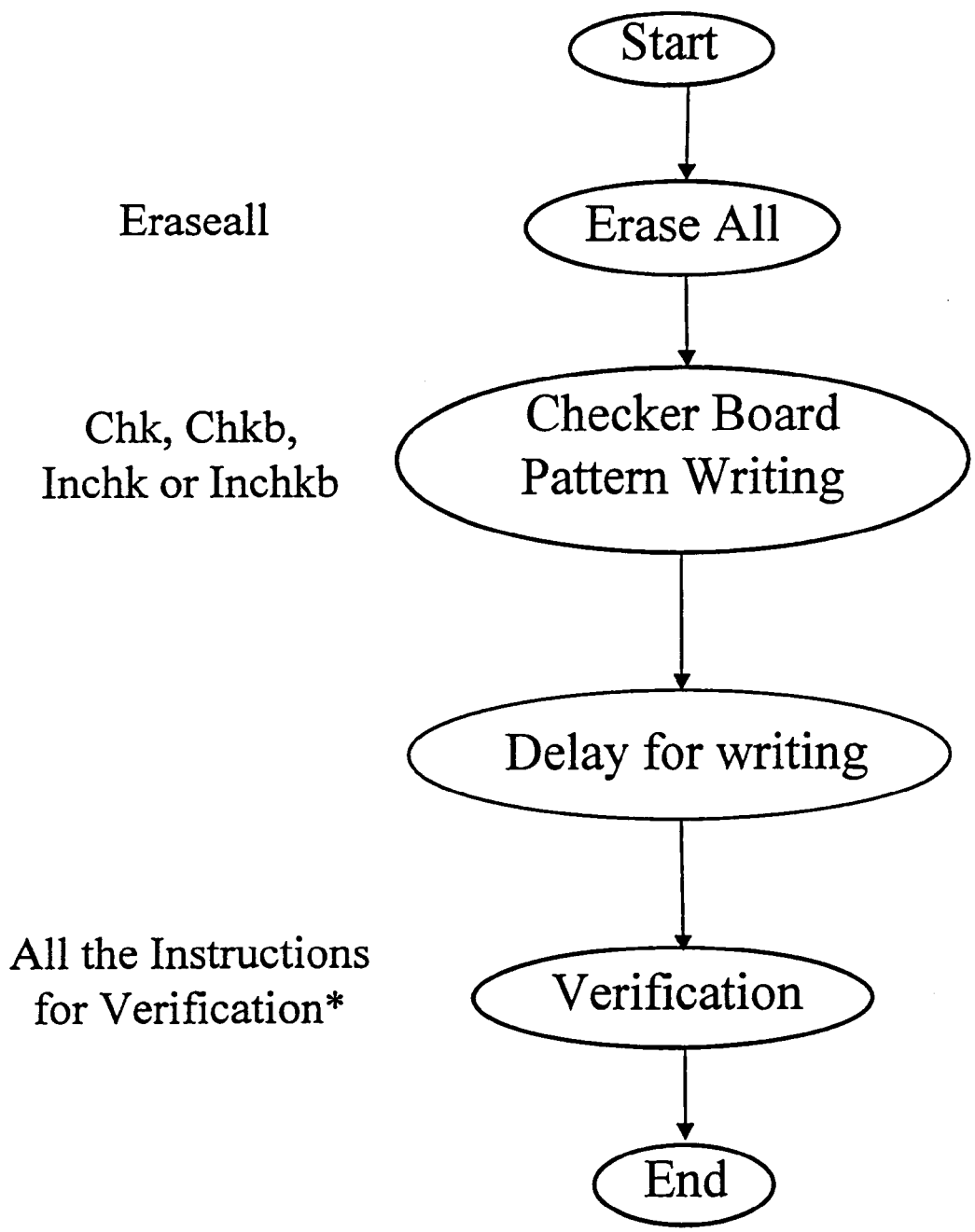
FIG. 16 is a checker board testing flow chart illustrative of a typical check board, check board B, inverse check board, and inverse check board B, in accordance with the invention.

FIG. 16 shows the flow chart of checkerboard and inverse checkerboard testing procedure. This process is simpler than above two procedures.

1. Start, get the device prepared for checkerboard and inverse checkerboard testing.
2. Erase all memory cells using Eraseall instruction as mentioned in programming procedure #1 step.
3. The State Machine 30 goes to Capture_IR state, and sets the Instruction Register 40 to the Check Board (Chk, Chkb, Inchk, Inchkb) state. This instruction sets the PLD device to the check board pattern writing process. The TMS gives the delay time for this check board pattern writing. Because of the special circuits designed, which have been described above, the check board process is executed at once, using Check Board (Chk) instruction.
4. Verification, go to verification procedure (FIG. 13, Verification flow chart) read the checkerboard pattern out and compare it with the pattern stored in tester before the testing to see if the device has a checkerboard pattern error.

Figure 17:
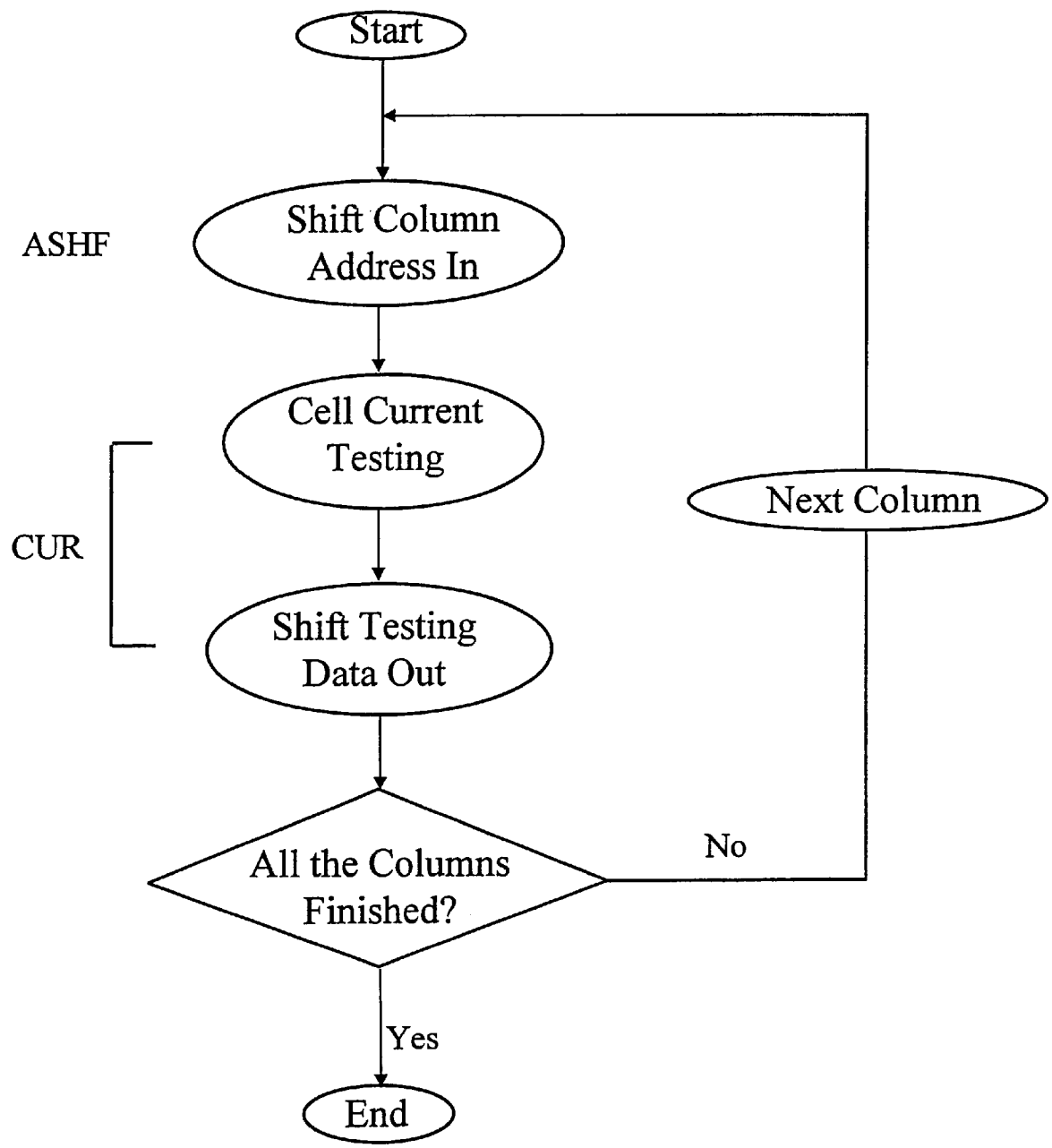
FIG. 17 is a cell current testing flow chart, illustrative of a typical cell current measurement sequence, in accordance with the invention.

FIG. 17 shows the flow chart of cell current measurement. This flow chart is very similar to the verification procedure 1. Start, get the device prepared for cell current test.
2. Shift column address in. The State Machine 30 goes to shift state and sets the Instruction Register 40 to the Address Shift (ASHF) state. The ASHF instruction 11 shifts column address in and chooses the column to be tested.
3. A Capture_DR from TAP control state machine 30 is applied to clear or set terminals of register 160. The shift register has an initial state in which Q0=1 (FIG. 6) and all other output of the registers are '0', in order to read the bottom memory cell at this column and read the cell current, and send the data out to TDO 14. The only difference from the verification step is that the read signal is sent out through CUR Circuit 195, as shown in FIG. 7, instead of through VE Circuit 196.
4. The '1' shifts up one register at one clock of the shifting and the corresponding row is selected separately. The '1' will continually shift up until it reaches the top line so that the whole column will be read out.
5. Go back to step 2 to circle the above operation until the last column of the memory cell array in the device is processed.

The invention described is a specific embodiment and is merely illustrative of the principles of this invention and is not to be construed as limiting the invention. Various modifications and applications can be made by those skilled in the art without departing from the true spirit and scope of the invention.

What is claimed is:

1. A structure for high density programmable logic device programming, verification and testing comprising:

a column address shift register and address decoder for shifting in column address to select the column of the said high density programmable logic device memory to be programmed, verified or tested;

a row data shift register for shifting in row data to control a row selection and word line driver of the said high density programmable logic device memory to be programmed, verified or tested;

controlling means for switching said high density programmable logic device memory between said testing, verifying and programming state;

a control gate voltage generator for generating different control gate voltages according to said programming, verifying and testing operation;

a high voltage generator for generating the high voltage needed in said programming, verifying and testing operation;

a test address shift register for shifting in the address for testing column address decoder;

an instruction register and instruction decoder for selecting and controlling of said programming, verifying and testing operations of said programmable logic device; and a state controller for controlling said address shift register, said data shift register, said controlling means and said instruction register.

2. The structure defined in claim 1, wherein said row data shift register further includes means for controlling the direction of the data shifting according to the said programming, verifying and testing.

3. The structure defined in claim 1, wherein said row data shift register further includes means for loading an initial data for selecting row of said high density programmable logic device to be verified and tested.

4. The structure defined in claim 1, wherein said controlling means further includes:

circuits for generating control signals of checker and inverse checker board code writing;

a test data output buffer, outputting either verified voltage or current signals according to the testing or verifying mode; and a circuit for generating configurable supply voltage potentials of soft writing.

5. The structure defined in claim 4, wherein said circuits for generating control signals of checker and inverse checker board code writing further include:

circuits for pulling down even or odd word lines of said high density programmable logic device;

circuits for pulling down even or odd column bit lines of said high density programmable logic device; and circuits for selecting odd or even column of said high density programmable logic device for programming in said checker and inverse checker board.

6. The structure defined in claim 4, wherein said test data output buffer further includes:

a voltage path for outputting said verified voltage; and a current path for outputting said measured cell current.

7. The structure defined in claim 1 wherein said state controller further includes:

four interface signals TCK, TMS, TDI and TDO for interfacing with an external tester or programmer;

a state machine for sequencing states according to a control signal imposed on said interface signals; and a state decoder for generating state control signals according to the current state of the said state machine.

8. A structure for high density programmable logic device programming, verification and testing comprising:

a column address shift register and address decoder for shifting in column address, to select the column of the said high density programmable logic device memory to be programmed, verified or tested;

a row data shift register for shifting in row data, to control a row selection and word line driver of the said high density programmable logic device memory to be programmed, verified or tested;

controlling means for switching said high density programmable logic device memory between said testing, verifying and programming state;

a control gate voltage generator for generating different control gate voltages according to said programming, verifying and testing operation;

a high voltage generator for generating the high voltage needed in said programming, verifying and testing operation;

a test address shift register for shifting in the address for testing column address decoder;

an instruction register and instruction decoder for selecting and controlling said programming, verifying and testing operations of said programmable logic device;

a state controller for controlling said address shift register, said data shift register, said controlling means and said instruction register;

a preloading shift register for preloading the states of the normal operation registers in functional testing; and an external control gate voltage input pin for supplying control gate voltage externally for said cell current testing operation.

9. The structure defined in claim 8 wherein said row data shift register further includes means for controlling the direction of the data shifting according to the said programming, verifying and testing.

10. The structure defined in claim 8 wherein said row data shift register further includes means for loading an initial data for selecting row of said high density programmable logic device to be verified and tested.

11. The structure defined in claim 8, wherein said controlling means further includes:

circuits for generating control signals of checker and reverse checker board code writing;

a test data output buffer outputting either verified voltage or current signals according to the testing or verifying mode; and a circuit for generating configurable supply voltage potentials of soft writing.

12. The structure defined in claim 11, wherein said circuits for generating control signals of checker and reverse checker board code writing further include:

circuits for pulling down even or odd word lines of said high density programmable logic device;

circuits for pulling down even or odd column bit lines of said high density programmable logic device; and circuits for selecting odd or even column of said high density programmable logic device for programming in said checker and reverse checker board.

13. The structure defined in claim 11, wherein said test data output buffer further includes:

a voltage path for outputting said verified voltage; and a current path for outputting said measured cell current.

14. The structure defined in claim 8 wherein said state controller further includes:

four interface signals TCK, TMS, TDI and TDO for interfacing with an external tester or programmer;

a state machine for sequencing states according to a control signal imposed on said interface signals; and a state decoder for generating state control signals according to the current state of the said state machine.

15. The structure defined in claim 8, wherein said pre-loading shift register is constructed by serially connecting all the normal operation registers in said high density programmable logic device.

16. A method for programming, verifying and testing a high density programmable logic device under a universal supporting structure, said method comprising:

erasing all for bulk erasing said high density programmable logic device;

writing all for bulk writing said high density programmable logic device;

bit programming for programming said high density programmable logic device bit by bit;

bit verification for verifying said high density programmable logic device bit by bit;

checker board testing for testing said high density programmable logic device written in checker board and reverse checker board pattern;

cell current testing for measuring said high density programmable logic device cell current;

soft writing for adjusting internal writing voltage of said high density programmable logic device; and column address decoding test for testing column address decoder of said high density programmable logic device.

17. The method defined in claim 16, wherein the step of erasing all further includes the steps of:

shifting in the erase all instructions to an instruction register through a state controller interface; and waiting for a time period for erasing all.

18. The method defined in claim 16, wherein the step of writing all further includes the steps of:

shifting in the write all instructions to an instruction register through a state controller interface; and waiting for a time period for writing all.

19. The method defined in claim 16, wherein the step of bit programming further includes the steps of:

erasing all the cells in said high density programmable logic device using said erasing all steps;

shifting in column address to a column address register through a state controller interface to select the column containing the cells to be programmed;

shifting in programming instruction to an instruction register through said state controller interface;

shifting in row data to a row data shift register through said state controller interface to select the rows to be programmed; and waiting for a time period for writing one column.

20. The method defined in claim 16, wherein the step of bit verification further includes the steps of:

shifting in column address to a column address register through a state controller interface to select the column containing the cells to be verified;

shifting in verification instruction to an instruction register through said state controller interface; and shifting out verified codes in the selected column through said state controller interface.

21. The method defined in claim 16, wherein the step of checkerboard testing further includes the steps of:

erasing all the cells in said high density programmable logic device using said erasing all steps;

shifting in checker board code writing instruction to an instruction register through a state controller interface;

waiting for a time period for checker board code writing; and reading out the checker board code being written using said bit verification steps.

22. The method defined in claim 21, wherein said checkerboard testing further includes:

checkerboard testing of said high density programmable logic device;

checkerboard bar testing of said high density programmable logic device;

inverse checkerboard testing of said high density programmable logic device; and inverse checkerboard bar testing of said high density programmable logic device.

23. The method defined in claim 16, wherein said cell current testing further includes:

shifting in column address to a column address register through a state controller interface to select the column containing the cell to be tested;

shifting in cell current test instruction to an instruction register through said state controller interface; and shifting out measured current of the cells in selected column through said state controller interface.

24. A high density programmable logic device for implementing a configurable logic function, and having a universal structure supporting a serial algorithm for programming, verifying and testing, said high density programmable logic device comprising:

a plurality of programmable logic circuits for implementing said configurable logic function;

means for selecting a location of memory cells to be programmed, verified and tested in said high density programmable logic device;

means for controlling said testing functions of said high density programmable logic device;

an instruction register and instruction decoder for selecting and controlling said programming, verifying and testing operations of said programmable logic device; and a state controller for controlling the operation of said high density programmable logic device.

25. The high density programmable logic device defined in claim 24, wherein said means for controlling said testing functions includes:

circuits for controlling a checker and inverse checker board testing;

circuits for controlling a cell current measurement testing;

circuits for controlling a column address decoder testing; and circuits for controlling a functional testing data preloading.

26. The high density programmable logic device defined in claim 24, further comprising a control gate voltage generator for generating different control gate voltage according to said programming, verifying and testing operation.

27. The high density programmable logic device defined in claim 24, further comprising a high voltage generator for generating high voltage needed in said programming, verifying and testing operation.

28. The high density programmable logic device defined in claim 24, further comprising an external control gate voltage input pin for supplying control gate voltage externally for said cell current testing operation.

* * * * *